United States Patent
Lee et al.

(10) Patent No.: US 10,115,448 B2
(45) Date of Patent: Oct. 30, 2018

(54) MEMORY DEVICE FOR REFRESH AND MEMORY SYSTEM INCLUDING THE SAME

(71) Applicant: Samsung Electronics Co., Ltd., Suwon-si (KR)

(72) Inventors: Jong-Ho Lee, Seoul (KR); Seung-Jun Shin, Incheon (KR); Tae-Young Oh, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/194,784

(22) Filed: Jun. 28, 2016

(65) Prior Publication Data

US 2017/0110177 A1  Apr. 20, 2017

(30) Foreign Application Priority Data

Oct. 20, 2015  (KR) .......................... 10-2015-0145703

(51) Int. Cl.
*G11C 11/406* (2006.01)
*G06F 3/06* (2006.01)

(52) U.S. Cl.
CPC ...... *G11C 11/40615* (2013.01); *G06F 3/0619* (2013.01); *G06F 3/0659* (2013.01); *G06F 3/0683* (2013.01)

(58) Field of Classification Search
CPC ............ G11C 11/406; G11C 11/40615; G11C 11/40603; G11C 11/40611
See application file for complete search history.

(56) References Cited

U.S. PATENT DOCUMENTS

| | | | |
|---|---|---|---|
| 5,430,680 A | 7/1995 | Parris | |
| 5,583,818 A | 12/1996 | You et al. | |
| 5,796,669 A * | 8/1998 | Araki | G11C 7/1063 365/222 |
| 5,798,976 A * | 8/1998 | Arimoto | G11C 11/406 365/222 |
| 5,845,060 A * | 12/1998 | Vrba | G06F 11/1683 375/356 |
| 6,298,000 B1 * | 10/2001 | Kitade | G11C 11/406 365/189.07 |
| 6,426,908 B1 * | 7/2002 | Hidaka | G11C 5/14 365/222 |
| 6,721,225 B2 | 4/2004 | Tsukude | |
| 6,856,567 B2 | 2/2005 | Lee | |
| 7,099,234 B2 * | 8/2006 | Parris | G11C 5/144 365/222 |

(Continued)

*Primary Examiner* — Midys Rojas
*Assistant Examiner* — Khoa D Doan
(74) *Attorney, Agent, or Firm* — Muir Patent Law, PLLC

(57) ABSTRACT

A memory device includes a memory bank including a plurality of memory blocks, a row selection circuit and a refresh controller. The row selection circuit is configured to perform an access operation and a refresh operation with respect to the memory bank. The refresh controller is configured to control the row selection circuit such that the memory device is operated selectively in an access mode or a self-refresh mode in response to a self-refresh command received from a memory controller, the refresh operation is performed in the access mode in response to an active command received from the memory controller and the refresh operation is performed in the self-refresh mode in response to at least one clock signal.

16 Claims, 18 Drawing Sheets

(56) References Cited

U.S. PATENT DOCUMENTS

| | | | |
|---|---|---|---|
| 7,551,505 B1 | 6/2009 | Daniel | |
| 7,701,753 B2 | 4/2010 | Oh | |
| 9,607,678 B2* | 3/2017 | Oh | G11C 11/40615 |
| 2001/0007538 A1* | 7/2001 | Leung | G06F 12/0893 |
| | | | 365/222 |
| 2001/0018726 A1* | 8/2001 | Tabo | G06F 13/1636 |
| | | | 711/106 |
| 2001/0045579 A1* | 11/2001 | Ooishi | G11C 7/1006 |
| | | | 257/222 |
| 2001/0048623 A1* | 12/2001 | Tanizaki | G11C 11/406 |
| | | | 365/200 |
| 2002/0031030 A1* | 3/2002 | Choi | G11C 11/406 |
| | | | 365/222 |
| 2003/0007407 A1* | 1/2003 | Miyamoto | G11C 11/406 |
| | | | 365/222 |
| 2003/0026161 A1* | 2/2003 | Yamaguchi | G11C 7/1006 |
| | | | 365/230.03 |
| 2003/0033492 A1* | 2/2003 | Akiyama | G06F 12/0893 |
| | | | 711/156 |
| 2003/0076726 A1* | 4/2003 | Cowles | G11C 11/406 |
| | | | 365/222 |
| 2004/0081011 A1* | 4/2004 | Maruyama | G11C 11/406 |
| | | | 365/233.1 |
| 2005/0078538 A1* | 4/2005 | Hoehler | G11C 11/40622 |
| | | | 365/222 |
| 2005/0108460 A1* | 5/2005 | David | G11C 11/406 |
| | | | 711/5 |
| 2005/0286331 A1* | 12/2005 | Ito | G11C 11/406 |
| | | | 365/222 |
| 2006/0018174 A1* | 1/2006 | Park | G11C 11/406 |
| | | | 365/222 |
| 2006/0098510 A1* | 5/2006 | Jo | G11C 11/40611 |
| | | | 365/222 |
| 2006/0143372 A1* | 6/2006 | Walker | G11C 11/406 |
| | | | 711/106 |
| 2007/0171750 A1* | 7/2007 | Oh | G11C 11/406 |
| | | | 365/222 |
| 2009/0003094 A1* | 1/2009 | Jung | G11C 11/406 |
| | | | 365/191 |
| 2009/0080278 A1* | 3/2009 | Schoenfeld | G11O 5/14 |
| | | | 365/222 |
| 2009/0161467 A1* | 6/2009 | Lin | G11C 11/40603 |
| | | | 365/222 |
| 2009/0251982 A1* | 10/2009 | Ware | G11C 11/406 |
| | | | 365/222 |
| 2013/0028038 A1* | 1/2013 | Fujisawa | G11C 7/222 |
| | | | 365/222 |
| 2014/0006705 A1* | 1/2014 | Yu | G11C 11/40607 |
| | | | 711/106 |
| 2014/0185403 A1 | 7/2014 | Lai | |
| 2016/0027498 A1* | 1/2016 | Ware | G11C 11/40611 |
| | | | 365/222 |

* cited by examiner

FIG. 13

| MRSET | OP7 | OP6 | OP5 | OP4 | OP3 | OP2 | OP1 | OP0 |
|---|---|---|---|---|---|---|---|---|
| | 0 | 0 | 0 | 0 | 1 | 0 | 1 | 0 |
| BANK | H | G | F | E | D | C | B | A |

MEMORY DEVICE FOR REFRESH AND MEMORY SYSTEM INCLUDING THE SAME

CROSS-REFERENCE TO RELATED APPLICATION

This U.S. Non-provisional application claims priority under 35 USC § 119 to Korean Patent Application No. 10-2015-0145703, filed on Oct. 20, 2015, in the Korean Intellectual Property Office (KIPO), the disclosure of which is incorporated by reference in its entirety herein.

BACKGROUND

1. Technical Field

Example embodiments relate generally to semiconductor integrated circuit, and more particularly to a memory device for refresh and a memory system including the memory device.

2. Discussion of the Related Art

Semiconductor memory devices for storing data may be classified into volatile memory devices and non-volatile memory devices. Volatile memory devices, such as dynamic random access memory (DRAM) devices, are typically configured to store data by charging or discharging capacitors in memory cells, and lose the stored data when power is off. Non-volatile memory devices, such as flash memory devices, may maintain stored data even though power is off. Volatile memory devices are widely used as main memories of various apparatuses, while non-volatile memory devices are widely used for storing program code and/or data in various electronic devices, such as computers, mobile devices, etc.

In the volatile memory devices, cell charges stored in a memory cell may be lost by a leakage current. In addition, when a wordline is transitioned frequently between an active state and a precharged state, that is, when the wordline is accessed intensively or frequently, the affected memory cell connected to the adjacent wordline may lose the stored charges. The charges of the memory cell have to be recharged before the data are lost by the leakage of the cell charges. Such recharge of the cell charges is referred to as a refresh operation and the refresh operation often has to be performed repeatedly before the cell charges are lost significantly. In high-speed memory device, the time for refresh may become a major factor in decreasing the speed of the memory device.

SUMMARY

At least one example embodiment of the present disclosure may provide a memory device capable of an efficient refresh operation.

At least one example embodiment of the present disclosure may provide a memory system including a memory device capable of an efficient refresh operation.

According to example embodiments, a memory device includes a memory bank including a plurality of memory blocks, a row selection circuit and a refresh controller. The row selection circuit performs an access operation and a refresh operation with respect to the memory bank. The refresh controller controls the row selection circuit such that the memory device is operated selectively in an access mode or a self-refresh mode in response to a self-refresh command received from a memory controller, the refresh operation is performed in the access mode in response to an active command received from the memory controller and the refresh operation is performed in the self-refresh mode in response to at least one clock signal.

The refresh controller may, when entering the self-refresh mode, control the row selection circuit such that the refresh operation is performed first by a burst number in response to a first clock signal having a first clock period, and then in response to a second clock signal having a second clock period longer than the first clock period.

The memory device may further include a mode register configured to store burst information for controlling the memory device. The burst number may be determined based on the burst information stored in the mode register and the burst information may be provided through a mode register write command received from the memory controller.

The refresh controller may include a pull-in counter configured to store a count value changing between a minimum count value and a maximum count value such that the count value is increased whenever the refresh operation for one row of the memory bank is completed and the count value is decreased whenever an average refresh interval time elapses.

The burst number may be determined based on a time point when the count value of the pull-in counter attains the maximum count value.

The refresh controller may, when the count value of the pull-in counter corresponds to the maximum count value, control the row selection circuit such that the refresh operation of the memory bank is not performed even though the active command is received.

The memory controller may generate the self-refresh command based on a frequency of generating the active command.

The refresh controller may generate an attention signal that is activated when the refresh operation is required with respect to the memory bank. The memory controller may generate the self-refresh command based on the attention signal.

The row selection circuit may, in the access mode, enable a first memory block corresponding to an access address among the plurality of memory blocks and selectively enable or disable a second memory block corresponding to a refresh address among the plurality of memory blocks. The row selection circuit may, in the self-refresh mode, enable the second memory block corresponding to the refresh address.

The memory device may be a three-dimensional memory device where a plurality of semiconductor dies are stacked vertically.

According to example embodiments, a memory system includes a memory device and a memory controller configured to control the memory device. The memory device includes a plurality of memory banks, a plurality of bank row selection circuits and a refresh controller. Each memory bank includes a plurality of memory blocks. The plurality of bank row selection circuits perform an access operation and a refresh operation with respect to the plurality of memory banks. The refresh controller controls the plurality of bank row selection circuits such that the memory device is operated selectively in an access mode or a self-refresh mode in response to a self-refresh command received from the memory controller, the refresh operation is performed in the access mode in response to an active command received from the memory controller and the refresh operation is performed in the self-refresh mode in response to at least one clock signal.

The refresh controller may, when entering the self-refresh mode, control the plurality of bank row selection circuits such that the refresh operation is performed first by a burst number in response to a first clock signal having a first clock period, and then in response to a second clock signal having a second clock period longer than the first clock period.

The memory controller may generate the self-refresh command based on a frequency of generating the active command and generate a self-refresh entry command when an idle state in which the access operation is not performed with respect to all of the plurality of memory banks is maintained for a predetermined amount of time.

The refresh controller may generate an attention signal that is activated when the refresh operation is required with respect to at least one of the plurality of memory banks. The memory controller may generate a refresh command based on the attention signal.

The memory device may further include a mode register configured to store refresh bank information for controlling the memory device. The refresh bank information represents memory banks to be required the refresh operation among the plurality of memory banks. The memory controller may generate a mode register read command to receive the refresh bank information from the memory device and generate a refresh command based on the received refresh bank information.

The memory device and the memory system including the memory device according to example embodiments may prevent collision between the access operation and the refresh operation by performing the mode switching between the access mode and the self-refresh mode in response to a command received from the memory controller.

The memory device and the memory system including the memory device according to example embodiments may enhance efficiency of access to the memory device by performing the refresh operation during the access mode without receiving the refresh command from the memory controller.

The memory device and the memory system including the memory device according to example embodiments may prevent data loss by performing the burst self-refresh and then performing the normal self-refresh when entering the self-refresh mode.

According to example embodiments, a memory device includes a memory cell array including a plurality of memory banks, each bank having a plurality of memory cells arranged in rows and columns, a row decoder configured to select one or more rows for a refresh operation, a refresh control circuit configured to control the row decoder such that the memory device performs the refresh operation. The memory device may be configured to start the refresh operation a predetermined amount of time after all of the memory banks are not activated.

BRIEF DESCRIPTION OF THE DRAWINGS

Example embodiments of the present disclosure will be more clearly understood from the following detailed description taken in conjunction with the accompanying drawings.

FIG. 13 is a diagram for describing a mode register for the refresh operation based on the attention signal of FIG. 12.

DETAILED DESCRIPTION OF THE EMBODIMENTS

Figure 1:
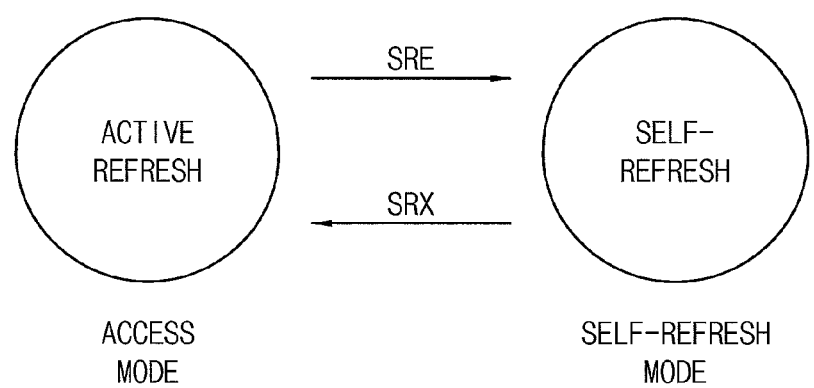
FIG. 1 is a diagram illustrating operation modes of a memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items. Expressions such as "at least one of" when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
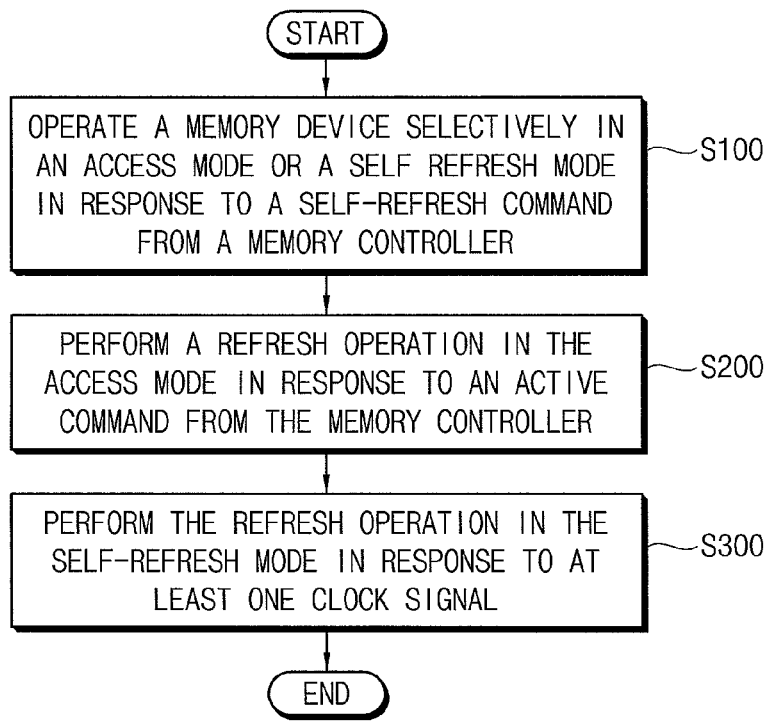
FIG. 2 is a flow chart illustrating a method of controlling refresh of a memory device according to example embodiments.

FIG. 1 is a diagram illustrating operation modes of a memory device according to example embodiment, and FIG. 2 is a flow chart illustrating a method of controlling refresh of a memory device according to example embodiments.

Referring to FIGS. 1 and 2, a memory device according to example embodiments may be operated selectively in an access mode (e.g., a read or a write operation) or a self-refresh mode in response to a self-refresh command from a memory controller (S100). For example, the memory device may change the operation mode from the access mode to the self-refresh mode in response to a self-refresh entry command SRE transferred from the memory controller. In addition, the memory device may change the operation mode from the self-refresh mode to the access mode in response to a self-refresh exit command SRX transferred from the memory controller. The memory device may determine refresh-required memory bank in itself and may perform the self-refresh without the refresh command from the memory controller. In this case, however, collision between the access operation and the self-refresh operation may occur if the access operation is performed with respect to a memory bank in which the self-refresh is performed. The memory controller should remember the access command of the collision to retry the access operation after elapse of a predetermined time. The memory device and a memory system including the memory device according to example embodiments may prevent the collision between the access operation and the refresh operation by performing the mode switching between the access mode and the self-refresh mode in response to a command (e.g., self-refresh command) from the memory controller.

The memory device may perform a refresh operation in the access mode in response to an active command received from the memory controller (S200). In the access mode, the refresh operation may be performed in response to the active command without receiving an extra refresh command from the memory controller. Such refresh operation in the access mode may be referred to as an active refresh operation. The active refresh operation will be further described below with reference to FIGS. 8 through 11. As such, the memory device and the memory system including the memory device according to example embodiments may enhance efficiency of access to the memory device by performing the refresh operation during the access mode without receiving the refresh command from the memory controller.

The memory device may perform the refresh operation in the self-refresh mode in response to at least one clock signal (S300). In some example embodiments, when entering the self-refresh mode, the memory device may perform a refresh operation by a burst number in response to a first clock signal having a first clock period (e.g., a burst self-refresh operation) and then perform a refresh operation in response to a second clock signal having a second clock period longer than the first clock period (e.g., a normal self-refresh operation). Such refresh operation in the self-refresh mode may be referred to as a self-refresh operation. The self-refresh operation will be described with reference to FIGS. 5 through 7. the memory device and the memory system including the memory device according to example embodiments may prevent data loss by performing the burst self-refresh operation and then performing the normal self-refresh operation when entering the self-refresh mode.

Figure 3:
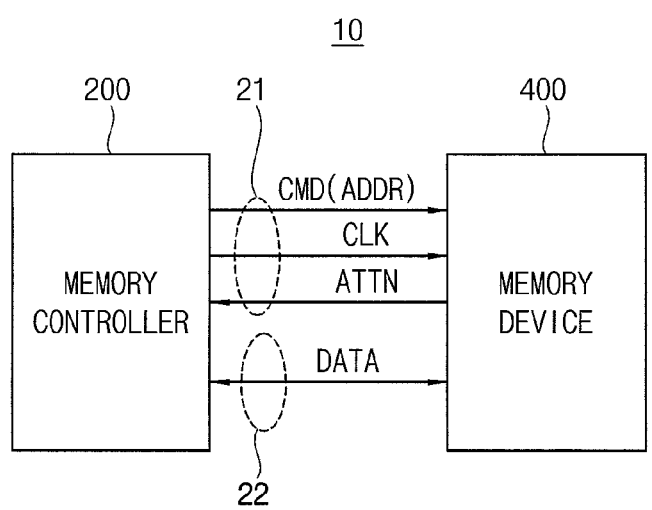
FIG. 3 is a block diagram illustrating a memory system according to example embodiments.
Figure 4:
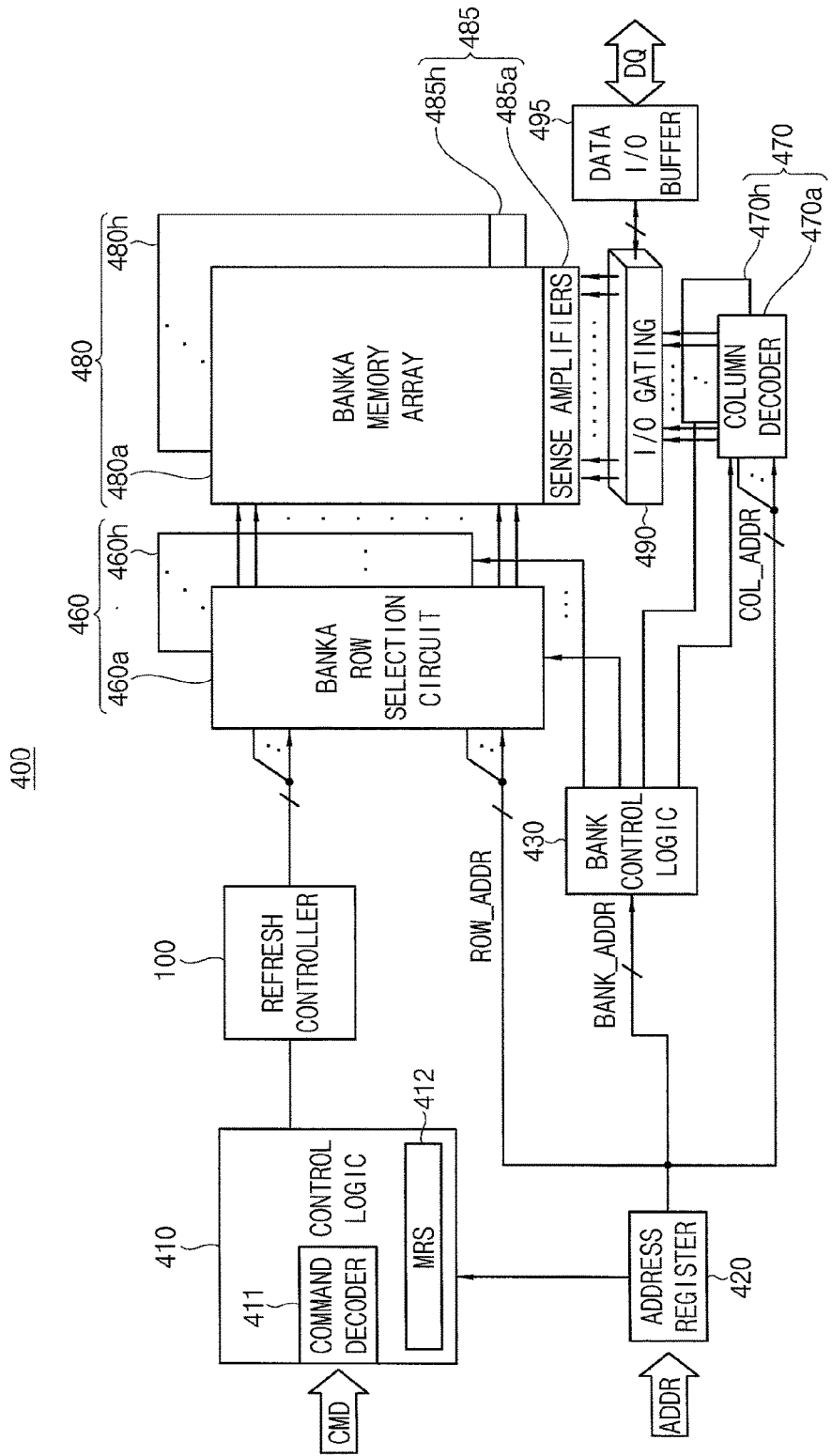
FIG. 4 is a block diagram illustrating a memory device included in the memory system of FIG. 3.

FIG. 3 is a block diagram illustrating a memory system according to example embodiments, and FIG. 4 is a block diagram illustrating a memory device included in the memory system of FIG. 3.

As used herein, a semiconductor device may refer to various items such as a memory device, one or more logic devices or memory cells formed in or on a semiconductor substrate, a semiconductor chip, a memory chip, a memory die, a logic chip, a package, a package including one or memory chips and optionally one or more logic chips, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

Referring to FIG. 3, a memory system 10 includes a memory controller 200 and a memory device 400. The memory controller 200 and the memory device 400 include respective interfaces for mutual communication. The interfaces may be connected through a control bus 21 for transferring a command CMD, an address ADDR, a clock signal CLK, etc. and a data bus 22 for transferring data. According to some standards for memory devices, the address ADDR may be incorporated in the command CMD. In example embodiments, the control bus 21 may include a combined command CMD and an address ADDR (e.g., CMD/ADDR) signal. The memory controller 200 may generate the command CMD to control the memory device 400 and the data may be written in or read from the memory device 400 under the control of the memory controller 200. According to example embodiments, the memory device 400 may be operated selectively in the access mode or the self-refresh mode in response to the self-refresh command received from the memory controller 200, perform the refresh operation in the access mode in response to the active command received from the memory controller 200 and perform the refresh operation in the self-refresh mode in response to at least one clock signal. In some example embodiments, as will be described below with reference to FIGS. 12 and 13, the memory device 400 may generate an attention signal ATTN that is activated when the refresh operation is required with respect to at least one of a plurality of memory banks. The memory controller 200 may generate a refresh command based on the attention signal ATTN.

Referring to FIG. 4, the memory device 400 may include a control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495 and a refresh controller 100. As used herein, a "unit" may refer to a "circuit."

The memory cell array 480 may include a plurality of bank arrays 480a~480h. The row selection circuit 460 may include a plurality of bank row selection circuits 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a~460h corresponding to the bank address BANK_ADDR may be activated in response to the bank control signals, and one of the bank column decoders 470a~470h corresponding to the bank address BANK_ADDR may be activated in response to the bank control signals.

The row address ROW_ADDR from the address register 420 may be applied to the bank row selection circuits 460a~460h. The activated one of the bank row selection circuits 460a~460h may decode the row address ROW_ADDR, and may activate a wordline corresponding to the row address ROW_ADDR. For example, the activated bank row selection circuit may apply a wordline driving voltage to the wordline corresponding to the row address ROW_ADDR.

The column decoder 470 may include a column address latch (not shown). The column address latch may receive the column address COL_ADDR from the address register 420, and may temporarily store the received column address COL_ADDR. In some embodiments, in a burst mode, the column address latch may generate column addresses that increment from the received column address COL_ADDR. The column address latch may apply the temporarily stored or generated column address to the bank column decoders 470a~470h.

The activated one of the bank column decoders 470a~470h may decode the column address COL_ADDR and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~485h coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation, a read operation, or a refresh operation. The control logic 410 may include a command decoder 411 that decodes a command CMD received from the memory controller 200 and a mode register set (MRS) 412 that sets an operation mode of the memory device 400.

Although FIG. 4 illustrates the control logic 410 and the address register 420 that are distinct from each other, the control logic 410 and the address register 420 may be implemented as a single inseparable circuit. In addition, although FIG. 4 illustrates the command CMD and the address ADDR are provided as distinct signals, the command CMD and the address ADDR may be provided as a combined signals as specified by LPDDR5 standards.

The refresh controller 100 may generate signals for controlling the refresh operation of the memory device 400. According to example embodiments, the refresh controller 100 may control the row selection circuit 460 such that the memory device 400 may be operated selectively in the access mode or the self-refresh mode in response to the self-refresh command received from the memory controller, the refresh operation may be performed in the access mode in response to an active command received from the memory controller and the refresh operation may be performed in the self-refresh mode in response to at least one clock signal.

Figure 5:
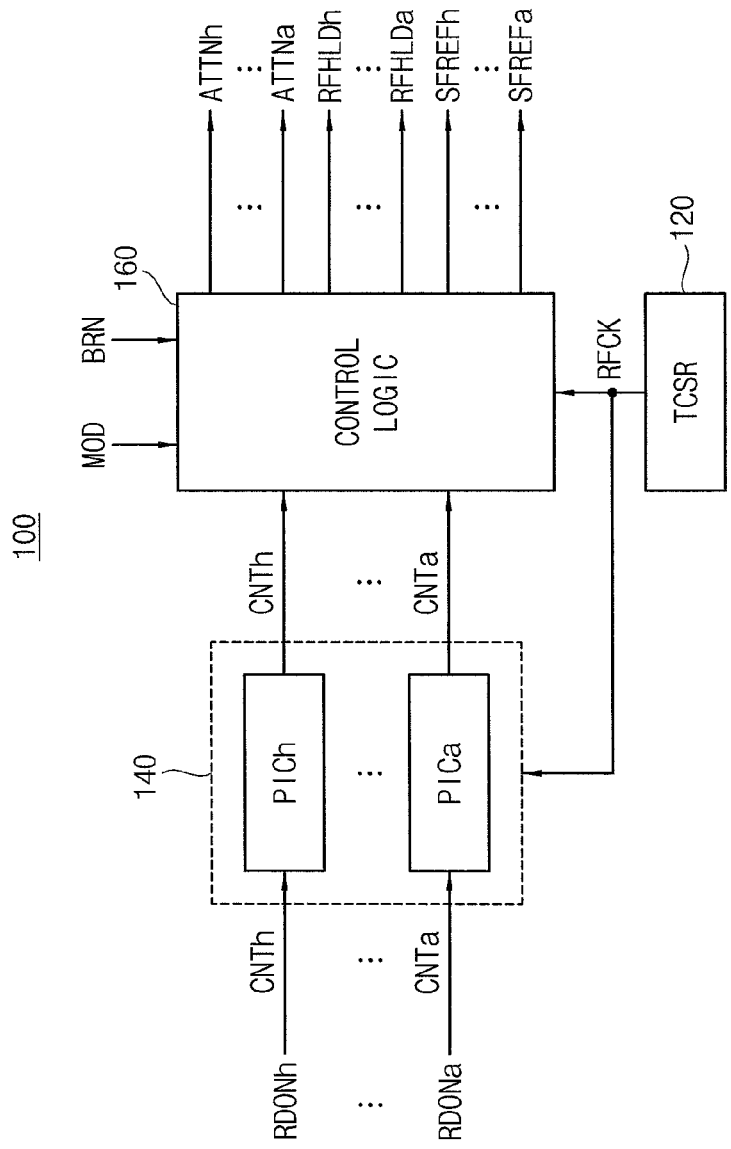
FIG. 5 is a block diagram illustrating an example of a refresh controller included in the memory device of FIG. 4.

FIG. 5 is a block diagram illustrating an example of a refresh controller included in the memory device of FIG. 4.

Referring to FIG. 5, a refresh controller 100 may include a temperature compensate self-refresh (TCSR) unit 120, a counter block 140 and a control logic 160.

Figure 11:
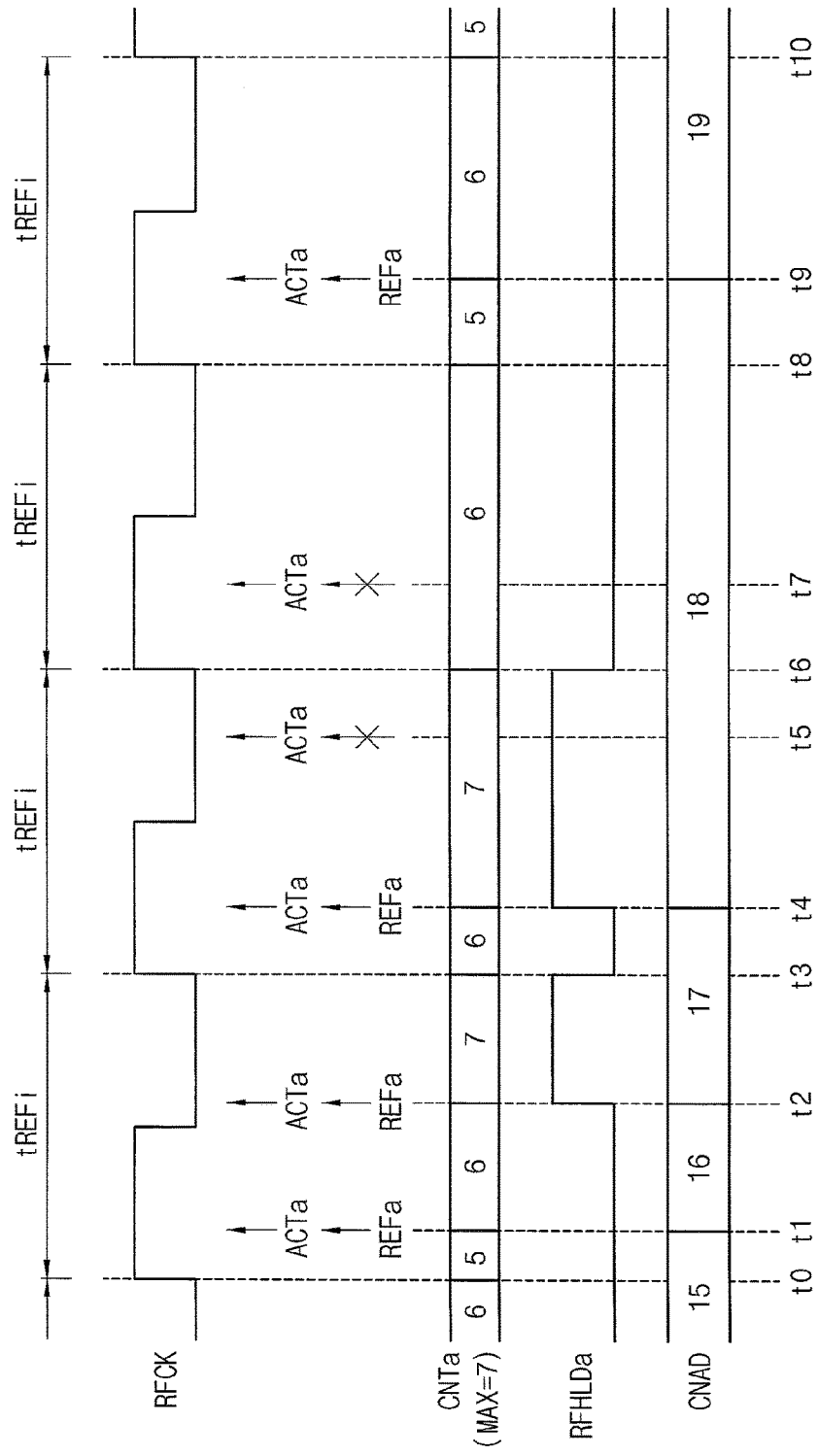
FIG. 11 is a timing diagram for describing a case that an active refresh operation is not performed in a memory device according to example embodiments.

The TCSR unit 120 may generate a refresh clock signal RFCK having a clock period of an average refresh interval time tREFi as illustrated in FIG. 11. The average refresh interval time tREFi may represent an average time between the two successive refresh operations for the rows (as used herein, a "row" may refer to a "wordline") of the same memory bank. For example, the average refresh interval time tREFi may be, for example, 3.9 us (microseconds) or 7.8 us, and may be changed depending on the operation temperature of the memory device 400. The average refresh interval time tREFi may be decreased as the operation temperature is increased.

The counter block 140 may include a plurality of pull-in counters PICa~PICh corresponding to the memory banks 480a~480h.

The pull-in counters PICa~PICh may store respective count values CNTa~CNTh. Each count value may change between a minimum count value and a maximum count value such that the count value is increased whenever the refresh operation for one row of the corresponding memory bank is completed and the count value is decreased whenever the average refresh interval time tREFi elapses. The maximum count value and the minimum count value of the pull-in counters PICa~PICh may be set to proper numbers according to the configuration of the memory system. For example, the maximum count value may be 7 and the minimum count value may be 0.

The timing of completing the refresh operation for each of the memory banks 480a~480h may be provided through refresh done signals RDONa~RDONh from each of the bank row selection circuits 460a~460h. Each of the pull-in counters PICa~PICh may increase the stored count value by a predetermined value (e.g., 1) whenever each of the refresh done signals RDONa~RDONh is activated.

The average refresh interval time tREFi may corresponds to the clock period of the refresh clock signal RFCK. Each of the pull-in counters PICa~PICh may decrease the stored count value by a predetermined value (e.g., 1) whenever average refresh interval time tREFi elapses, that is, in synchronization with edges (e.g., rising edges) of the refresh clock signal RFCK.

The control logic 160 may generate control signals for controlling the refresh operation of the memory device 400 based on a mode signal MOD, a burst number BRN and the refresh clock signal RFCK. The control signals may include self-refresh control signals SFREFa~SFREFh, refresh hold signals RFHLDa~RFHLDh and attention signals ATTNa~ATTNh corresponding to the memory banks 480a~480h, respectively.

The control logic 160 may activate each of the refresh hold signals RFHLDa~RFHLDh when each of the pull-in counters attains the maximum count value (e.g., 7) so that the corresponding bank row selection circuit may not perform the active refresh operation. Such refresh hold will be further described below with reference to FIG. 11. In addition, the control logic 160 may activate each of the attention signals ATTNa~ATTNh when the corresponding memory bank requires the refresh operation. For example, the control logic may activate each of the attention signals ATTNa~ATTNh when the count value of the corresponding pull-in counter attains the minimum count value (e.g., 0). The attention signal will be further described below with reference to FIG. 12.

The control logic 160 may activate the self-refresh signals SFREFa~SFREFh when the mode signal MOD indicates the self-refresh mode. The bank row selection circuits 460a~460h may perform the self-refresh operation based on the self-refresh signals SFREFa~SFREFh. In some example embodiments, the mode switching between the access mode and the self-refresh mode may be performed commonly with respect to all of the memory banks 480a~480h. In this case, the self-refresh signals SFREFa~SFREFh may be equal and may be represented as a single signal.

Hereinafter, the mode switching between the access mode and the self-refresh mode and the self-refresh operation in the self-refresh mode are described with reference to FIGS. 6 and 7.

Figure 6:
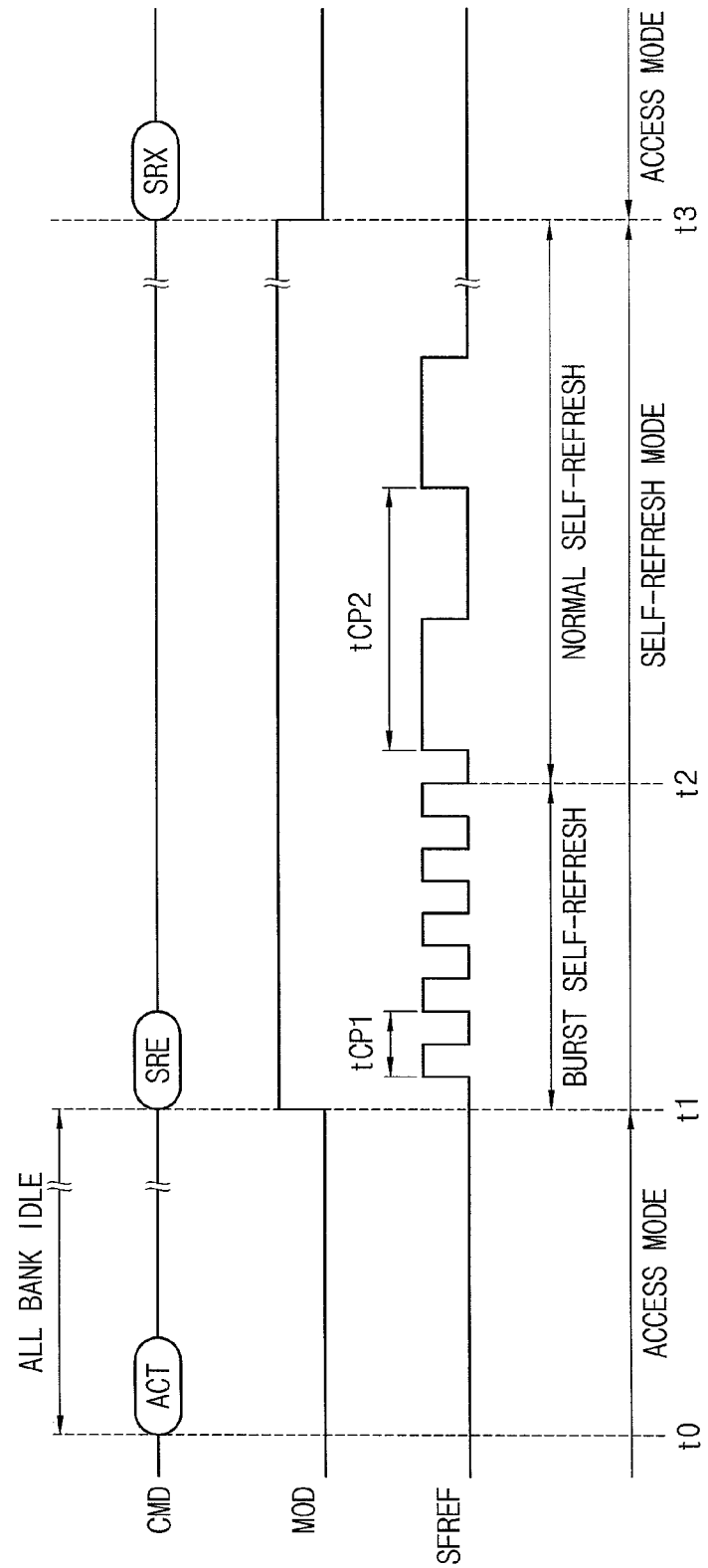
FIG. 6 is a timing diagram illustrating an example of a self-refresh operation of the memory device of FIG. 4.

FIG. 6 is a timing diagram illustrating an example of a self-refresh operation of the memory device of FIG. 4.

FIG. 6 shows a command signal CMD that is generated and provided from the memory controller 200, a mode signal MOD and a self-refresh signal SFREF that are generated in the memory device 400.

Referring to FIG. 6, the memory controller 200 may generate a self-refresh command including a self-refresh entry command SRE and a self-refresh exit command SRX based on a frequency of generating an active command ACT. For example, the memory controller 200 may generate the self-refresh entry command SRE when the memory controller 200 does not issue the active command ACT at time point t1 after a reference time (or a predetermined amount of time) from when the last active command ACT is issued at time point t0. In example embodiments, the memory controller 200 may generate the self-refresh entry command SRE when the all-bank idle state is maintained for the reference time. The memory device 400 may activate the mode signal MOD in response to the self-refresh entry command SRE. For example, the mode signal MOD may be generated by the control logic 410 in FIG. 4. Although FIG. 6 illustrates that the mode signal MOD is activated in the logic high level, the activation level of the mode signal MOD may be the logic low level. For example, in some embodiments, the memory controller 200 may be configured such that after an active command ACT is issued and as long as no other active commands ACT are issued after the completion, a refresh command (e.g., self-refresh command) is received a predetermined amount of time after the active command ACT is issued. In some embodiments, described further below, the memory device is configured to start a refresh operation a predetermined period of time after all of the memory banks of a memory are not activated. For example, one or more memory banks may be activated, and after the last one is activated, leading to a subsequent idle time among the memory banks, a refresh operation may be started a predetermined amount of time after the last memory bank is activated.

In some example embodiments, the reference time may be set to integer multiple of the average refresh interval time tREFi, that is, tREFi*K, where K is a positive integer. The positive integer K may corresponds to the maximum count value of the pull-in counters PICa~PICh. For example, all of the count values CNTa~CNTh of the pull-in counters PICa~PICh may be the minimum count value (e.g., 0) at time point t1 when the memory controller 200 generates the self-refresh entry command SRE.

When the mode signal MOD is activated at time point t1, the memory device 100 may change the operation mode from the access mode to the self-refresh mode. When the mode signal MOD indicates the self-refresh mode, the control logic 160 in FIG. 5 may activate the self-refresh signal SFREF. When entering the self-refresh mode, the control logic 160 may firstly activate the self-refresh signal SFREF by a burst number BRN with a first clock period tCP1 and then activate the self-refresh signal SFREF with a second clock period tCP2 longer than the first clock period tCP1. In response to such self-refresh signal SFREF, the bank row selection circuits 460a~460h may perform the burst self-refresh operation until time point t2 and then perform the normal self-refresh operation after time point t2. As will be described with reference to FIG. 7, the control logic 160 may generate the self-refresh signal SFREF using a first clock signal having the first clock period tCP1 and a second clock signal having the second clock period tCP2. As described above, the second clock signal may be the refresh clock signal RFCK in FIG. 5 that has the clock period of the average refresh interval time tREFi.

In some example embodiments, the burst number BRN may be determined based on burst information stored in the mode register set 412 in FIG. 4. The burst information may be provided through a mode register write command MRW from the memory controller 200. The mode register write operation is well known to those skilled in the art and detailed descriptions are omitted.

In other example embodiments, the burst number BRN may be determined based on a time point when each of the count values CNTa~CNTh of the pull-in counters PICa~PICh attain the maximum count value (e.g., 7). For example, all of the count values CNTa~CNTh may be the maximum count value at time point t2 when the burst refresh operation is finished. After time point t2, the normal self-refresh operation is performed and thus the count values CNTa~CNTh of the pull-in counters PICa~PICh may be increased by 1 per the average refresh internal time tREFi, that is, per the second clock period tCP2. In contrast, as described with reference to FIG. 5, the count values CNTa~CNTh may be decreased by 1 whenever the average refresh interval time tREFi elapses. As a result, the count values CNTa~CNTh of the pull-in counters PICa~PICh may be maintained at the maximum count value or a value smaller by 1 than the maximum count value during the time interval t2~t3 while the normal refresh operation is performed.

At time point t3, the memory controller 200 may require the access to the memory device 400 and generate the self-refresh exit command SRX. The memory device 400 may deactivate the mode signal MOD in response to the self-refresh exit command SRX. When the mode signal MOD is deactivated, the memory device 400 may change the operation mode from the self-refresh mode to the access mode.

Figure 7:
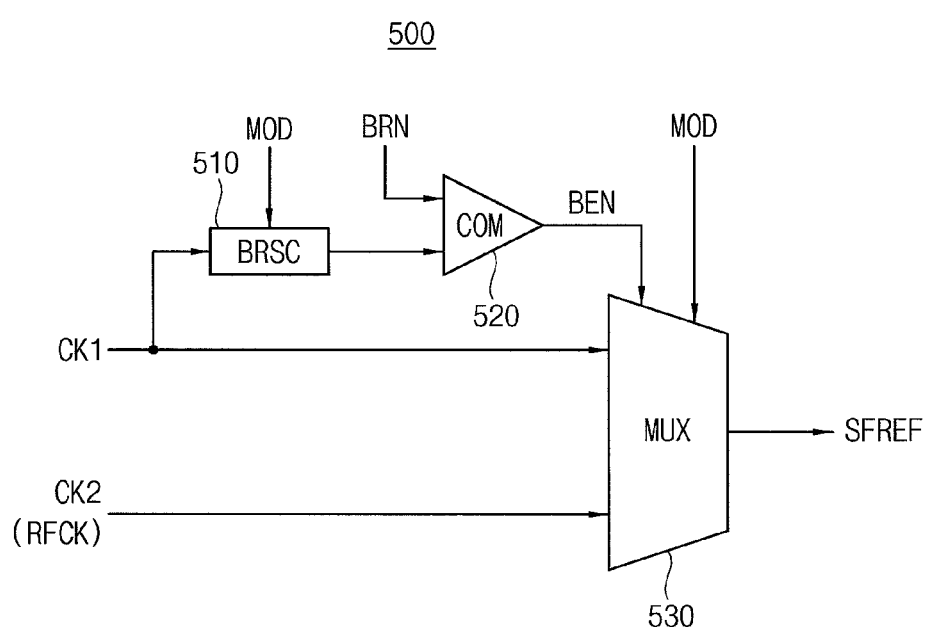
FIG. 7 is a block diagram illustrating a self-refresh signal generator according to example embodiments.

FIG. 7 is a block diagram illustrating a self-refresh signal generator according to example embodiments. The self-refresh signal generator 500 of FIG. 7 may be included in the control logic 160 in FIG. 5.

Referring to FIG. 7, the self-refresh signal generator 500 may include a burst counter BRSC 510, a comparator COM 520 and a selector MUX 530.

The selector 530 may select a first clock signal CK1 or a second clock signal CK2 based on the mode signal MOD and a burst enable signal BEN to generate the self-refresh signal SFREF. The first clock signal CK1 may have the first clock period tCP1 corresponding to the burst self-operation in FIG. 6 and the second clock signal CK2 may have the second clock period tCP2 corresponding to the normal self-operation in FIG. 6. As described above, the second clock signal CK2 may be the refresh clock signal RFCK having the clock period of the average refresh interval time tREFi.

The mode signal MOD may be activated in a first logic level (e.g. logic high level) to indicate the self-refresh mode and may be deactivated in a second logic level (e.g., logic low level) to indicate the access mode. The burst enable signal BEN may be activated in a first logic level (e.g. logic high level) to indicate the burst self-refresh mode and may be deactivated in a second logic level (e.g., logic low level) to indicate the normal self-refresh mode.

When the mode signal MOD is deactivated, that is, during time interval t0~t1 and after time point t3 in FIG. 6, the selector 630 may block both of the first clock signal CK1 and the second clock signal CK2 to deactivate the self-refresh signal SFREF regardless of the burst enable signal BEN.

When the mode signal MOD is activated and the burst enable signal BEN is activated, that is, during time interval t1~t2, the selector 530 may select and output the first clock signal CK1 as the self-refresh signal SFREF.

When the mode signal MOD is activated and the burst enable signal BEN is deactivated, that is, during time interval t2~t3, the selector 530 may select and output the second clock signal CK2 as the self-refresh signal SFREF.

Through such selective output of the clock signals CK1 and CK2, the self-refresh signal SFREF as illustrated in FIG. 6 may be generated.

The burst counter 510 and the comparator 520 may control the activation time interval of the burst enable signal BEN. The burst counter 510 may start counting at the time point when the mode signal MOD is activated to increase the count value of itself by 1 per edge (e.g., rising edge) of the first clock signal CK1 and the count value of the burst counter 510 may be initialized to 0 at the time point when the mode signal MOD is deactivated. The comparator 520 may compare the count value of the burst counter 510 with the burst number BRN and deactivate the burst enable signal BEN at time point when the count value is equal to the burst number BRN.

Accordingly, when entering the self-refresh mode, the self-refresh signal generator 500 may firstly activate the self-refresh signal SFREF by the burst number BRN with the first clock period tCP1 and then activate the self-refresh signal SFREF with the second clock period tCP2 longer than the first clock period tCP1. In response to such self-refresh signal SFREF, the bank row selection circuits 460a~460h in FIG. 4 may perform the burst self-refresh operation firstly and then the normal self-refresh operation.

Figure 8:
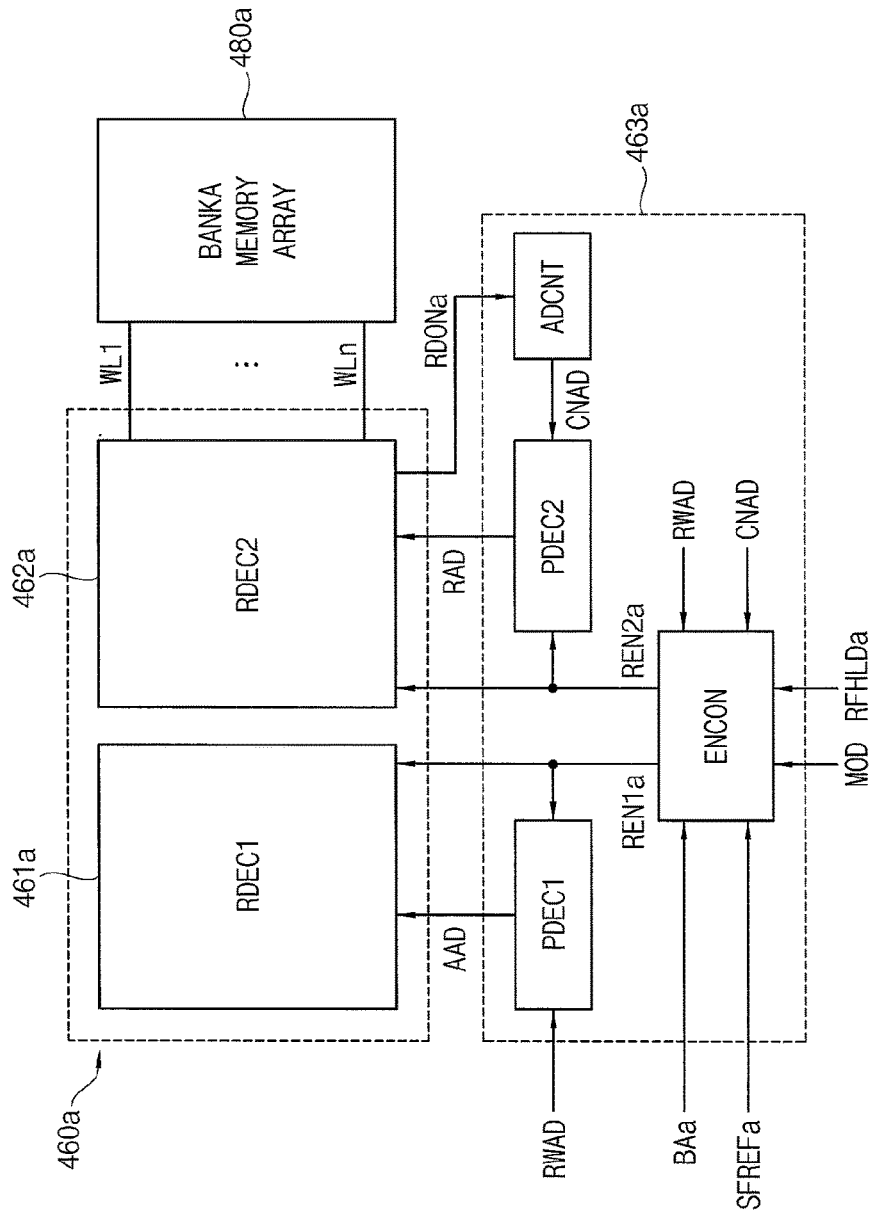
FIG. 8 is a block diagram illustrating an example of a bank row selection circuit included in the memory device of FIG. 4.

FIG. 8 is a block diagram illustrating an example of a bank row selection circuit included in the memory device of FIG. 4. Even though the configuration and the operation of the first bank row selection circuit 460a are described with reference to FIG. 8, the other bank row selection circuits 460b~460h in FIG. 4 can be understood similarly. For the convenience of description, the first bank memory array 480a is illustrated together in FIG. 8

Referring to FIG. 8, the first bank row selection circuit 460a may include a first row decoder RDEC1 461a, a second row decoder RDEC2 462a and a decoder control block 463a.

The first row decoder 461a may select, among the wordlines WL1~WLn, one wordline corresponding to an access address AAD in response to the access address AAD and a first row enable signal REN1a. The second row decoder 462a may select, among the wordlines WL1~WLn, one wordline corresponding to a refresh address signal RAD in response to the refresh address signal RAD and a second row enable signal REN2a. In addition, the second decoder 462a may generate the refresh done signal RDONa in FIG. 5, which is activated whenever the refresh operation with respect to the refresh address signal RAD is completed.

The decoder control block 463a may include an enable controller ENCON, a first predecoder PDEC1, a second predecoder PDEC2 and an address counter ADCNT.

The enable controller ENCON may generate the first row enable signal REN1a and the second row enable signal REN2a based on a bank control signal BAa, a self-refresh signal SFREFa, a mode signal MOD and a refresh hold signal RFHLDa. The first predecoder PDEC1 may generate the access address AAD based on a row address signal RWAD and the first row enable signal REN1a. The second predecoder PDEC2a may generate the refresh address RAD based on a counter address signal CNAD and the second row enable signal REN2a. The address counter ADCNT may generate the counter address signal CNAD that is increased or decreased sequentially in response to the refresh done signal RDONa.

As described above, the mode signal MOD may be deactivated to indicate the access mode and may be activated to indicate the self-refresh mode.

In the access mode, when the corresponding bank control signal BAa is activated, the enable controller ENCON may activate the first row enable signal REN1a and the first row decoder 461a may select and enable the wordline corresponding to the access address AAD in response to the activated first row enable signal REN1a.

Also in the access mode, the enable controller ENCON may selectively activate the second row enable signal REN2a in response to the activated bank control signal BAa. For example, the enable controller ENCON may not activate the second row enable signal REN2a if a particular condition is satisfied even though the bank control signal BAs is activated. Firstly, the enable controller ENCON may not activate the second row enable signal REN2a if the refresh hold signal RFHLDa is activated even though the bank control signal BAs is activated. Secondly, the enable controller ENCON may compare the row address signal RWAD and the counter address signal CNAD and may not activate the second row enable signal REN2a if refresh address RAD is in a refresh inhibition zone as will be described with reference to FIG. 9 even though the bank control signal BAs is activated.

When the second row enable signal REN2a is activated, the second decoder 462a may select and enable the wordline corresponding to the refresh address RAD. When the refresh operation is completed with respect to the enabled wordline, the second row decoder 462a may activate the refresh done signal RDONa, for example, in a pulse form. The address counter ADCNT may increase or decrease the counter address signal CNAD for the next refresh operation in response to the activation of the refresh done signal RDONa. If the second row enable signal REN2a is not activated, the refresh operation is omitted and the value of the counter address signal CNAD may be maintained.

In the self-refresh mode, the enable controller ENCON may activate the second row enable signal REN2a periodically in response to the self-refresh signal SFREFa. As described with reference to FIGS. 5 and 6, the control logic 160 may firstly activate the self-refresh signal SFREF by the burst number BRN with the first clock period tCP1 for the burst self-refresh operation and then activate the self-refresh signal SFREF with the second clock period tCP2 longer than the first clock period tCP1 for the normal self-refresh operation. The enable controller ENCON may activate the second row enable signal REN2a periodically in synchronization with the self-refresh signal SFREFa and the address counter ADCNT may increase or decrease the counter address signal CNAD periodically in response to the refresh done signal RDONa.

Although the first row decoder 461a and the second row decoder 462a are separated in FIG. 8, the first and second row decoders 461a and 462a may be integrated into a single row decoder in other example embodiments. For example, the single row decoder may adopt time-division multiplexing to receive the access address AAD in advance and then receive the refresh address RAD.

Figure 9:
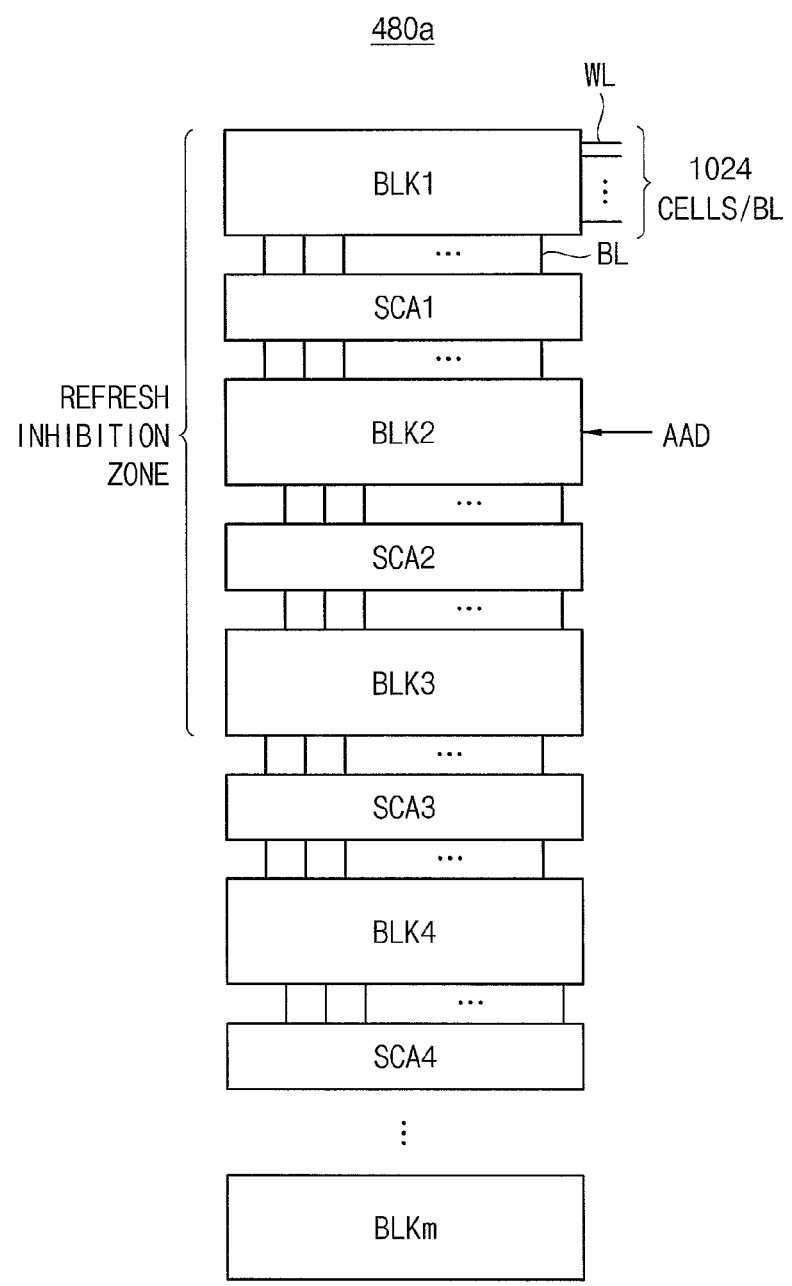
FIG. 9 is a block diagram illustrating an example of a memory bank included in the memory device of FIG. 4.

FIG. 9 is a block diagram illustrating an example of a memory bank included in the memory device of FIG. 4.

Referring to FIG. 9, the first memory bank 480a may include a plurality of memory blocks BLK1~BLKm. The sense amplifier unit 485 in FIG. 4 may include a plurality of sense amplifier circuits SAC1~SACm−1 that are distributed in the first memory bank 480a. Each of the memory blocks BLK1~BLKm may include a predetermined number of wordlines. For example, each of the memory blocks BLK1~BLKm may include 1024 memory cells per a bitline.

As illustrated in FIG. 9, each of the sense amplifier circuits SAC1~SACm−1 may be connected to the two adjacent memory blocks disposed at the top and bottom sides. For example, each of the sense amplifier circuits SAC1~SACm−1 may be connected to odd-numbered bitlines of the top-side memory block and even-numbered bitlines of the bottom-side memory block.

In this structure, if a wordline in one memory block is selected and is enabled for a general access operation (e.g., a read or a write operation), the wordlines in the one memory block and the two adjacent memory blocks cannot be selected and enabled simultaneously for the refresh operation. For example, when a wordline in the second memory block BLK2 is selected for the access operation, the other wordlines in the first, second and third memory blocks BLK1, BLK2 and BLK3 cannot be selected simultaneously for the refresh operation. As such, the wordlines or the rows, which cannot be selected for the refresh operation simultaneously with the access operation, may be referred to as a refresh inhibition zone.

The enable controller ENCON in FIG. 8 may compare the row address signal RWAD and the counter address signal CNAD and may not activate the second row enable signal REN2a if the refresh address RAD is included in the refresh inhibition zone although the bank control signal BAa is activated.

As such, in the access mode, the first bank row selection circuit 460a may enable an access memory block corresponding to the access address AAD among the plurality of memory blocks BLK1~BLKm and selectively enable or disable a refresh memory block corresponding to the refresh address RAD among the plurality of memory blocks BLK1~BLKm. In the self-refresh mode, the first bank row selection circuit 460a may enable the refresh memory block corresponding to the refresh address RAD.

Figure 10:
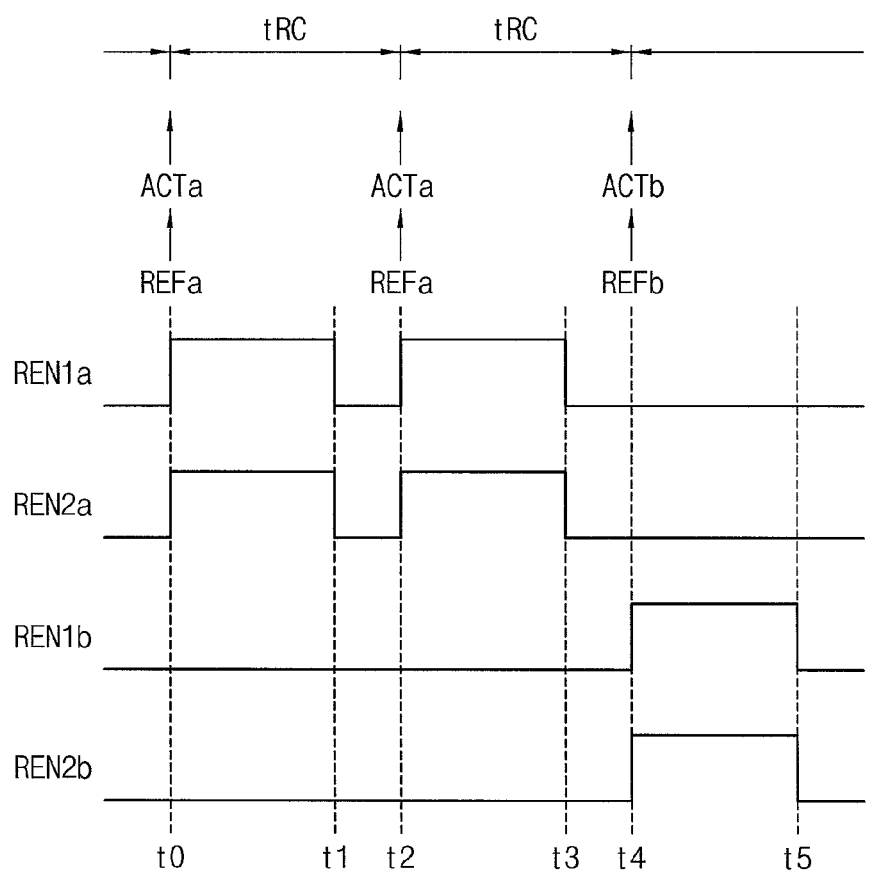
FIG. 10 is a timing diagram for describing an active refresh operation in an access mode of a memory device according to example embodiments.

FIG. 10 is a timing diagram for describing an active refresh operation in an access mode of a memory device according to example embodiments.

FIG. 10 illustrates a case when active commands for the first memory bank 480a or the second memory bank 480b in FIG. 4 are transferred from the memory controller 200 to the memory device 400 by an activation period tRC.

The activation period tRC may represent a minimum period for performing two consecutive access operation with respect to the same memory bank and each command may be transferred by the activation period tRC. In FIG. 10, the access operations performed by the active commands with respect to the first memory bank 480a and the second memory bank 480b are represented by ACTa and ACTb and the active refresh operations performed by the active commands with respect to the first memory bank 480a and the second memory bank 480b are represented by REFa and REFb.

In example embodiments, the active refresh operations REFa and REFb may be performed by the active commands with respect to the first memory bank 480a and the second memory bank 480b The first and second row enable signals REN1a and REN2a corresponding to the first memory bank 480a and the first and second row enable signals REN1b and REN2b corresponding to the second memory bank 480b as described with reference to FIG. 8 are illustrated in FIG. 10.

At time point t0, the memory device 400 receives the active command for the first memory bank 480a, and the first and second row enable signals REN1a and REN2a corresponding to the first memory bank 480a are activated. Thus the access operation ACTa for enabling the wordline corresponding to the access address AAD and the active refresh operation REFa for enabling the wordline corresponding to the refresh address RAD may be performed if the collision is not caused.

At time point t1, the access operation ACTa and the active refresh operation REFa are completed and thus the first and second row enable signals REN1a and REN2a may be deactivated to perform the precharge operation with respect to the first memory bank 480*a*.

At time interval t2~t3, an access operation ACTa for a new access address AAD and an active refresh operation REFa for a new refresh address RAD may be performed for the first memory bank 480*a* based on a new active command as time interval t0~t1.

At time point t4, the memory device 400 receives an active command for the second memory bank 480*b*, and the first and second row enable signals REN1*b* and REN2*b* corresponding to the second memory bank 480*b* are activated. Thus the access operation ACTb for enabling a wordline of the second memory bank 480*b* corresponding to an access address AAD and an active refresh operation REFb for enabling the wordline of the second memory bank 480*b* corresponding to a refresh address RAD may be performed if the collision is not caused.

At time point t5, the access operation ACTb and the active refresh operation REFb are completed and thus the first and second row enable signals REN1*b* and REN2*b* may be deactivated to perform the precharge operation with respect to the second memory bank 480*b*.

FIG. 11 is a timing diagram for describing a case that an active refresh operation is not performed in a memory device according to example embodiments. Even though the operation of the first bank row selection circuit 460*a* is described with reference to FIG. 11, the configurations and the operations of the other bank row selection circuits 460*b*-460*h* in FIG. 4 can be understood similarly.

The refresh clock signal RFCK may have the clock period of the average refresh interval time tREFi and the count value CNTa is stored in the pull-in counter PICa, as described above. The maximum count value is assumed to be 7 as illustrated in FIG. 11.

Referring to FIG. 11, at time point t0, the average refresh interval time tREFi elapses and the count value CNTa is decreased from 6 to 5.

At time point t1, an access operation ACTa for enabling a first row corresponding to a first access address AAD and a first active refresh operation REFa for enabling a second row corresponding to a first refresh address RAD may be performed simultaneously. According to the first active refresh operation REFa is performed, the count value CNTa is increased from 5 to 6. The counter address CNAD is increased from 15 to 16.

At time point t2, an access operation ACTa for enabling a third row corresponding to s second access address AAD and a second active refresh operation REFa for enabling a fourth row corresponding to a second refresh address RAD may be performed simultaneously. According to the second active refresh operation REFa is performed, the count value CNTa is increased from 6 to 7, that is, the maximum count value, and thus the refresh hold signal RFHLDa is activated (e.g., logic high level). The counter address CNAD is increased from 16 to 17.

At time point t3, the average refresh interval time tREFi elapses and the count value CNTa is decreased from 7 to 6. Accordingly the refresh hold signal RFHLDa is deactivated (e.g., logic low level).

At time point t4, an access operation ACTa for enabling a fifth row corresponding to a third access address AAD and a third active refresh operation REFa for enabling a sixth row corresponding to a third refresh address RAD may be performed simultaneously. According to the third active refresh operation REFa is performed, the count value CNTa is increased from 6 to 7 and thus the refresh hold signal RFHLDa is activated. The counter address CNAD is increased from 17 to 18.

At time t5, an access operation ACTa for enabling a seventh row corresponding to a fourth access address AAD may be performed but a corresponding active refresh operation REFa may not be performed because the refresh hold signal RFHLDa is activated and the second row enable signal REN2*a* is not activated by the enable controller ENCON as described with reference to FIG. 8. Using such refresh hold signal RFHLDa, the excessively frequent refresh operations may be prevented to reduce power consumption.

As such, the refresh controller 100 in FIG. 5 may control the first bank row selection circuit 460*a* such that the active refresh operation is not performed even though an active command corresponding to the memory bank 480*a* is received, if the count value CNTa of the pull-in counter PICa corresponds to the maximum count value.

At time point t6, the average refresh interval time tREFi elapses and the count value CNTa is decreased from 7 to 6. Accordingly the refresh hold signal RFHLDa is deactivated.

At time t7, an access operation ACTa for enabling an eighth row corresponding to a fifth access address AAD may be performed but a corresponding active refresh operation REFa may not be performed because a row corresponding to a corresponding refresh address RAD is included in the refresh inhibition zone as described with reference to FIG. 9. The refresh inhibition zone may occur in the open bitline structure as illustrated in FIG. 9.

Similarly, the count value CNTa is decreased from 6 to 5 at time point t8. A sixth access operation ACTa and a fourth active refresh operation REFa may be performed simultaneously, the count value CNTa is increased from 5 to 6 and the counter address CNAD is increased from 18 and 19 at time point t9. The count value CNTa is decreased from 6 to 5 at time point t10.

Figure 12:
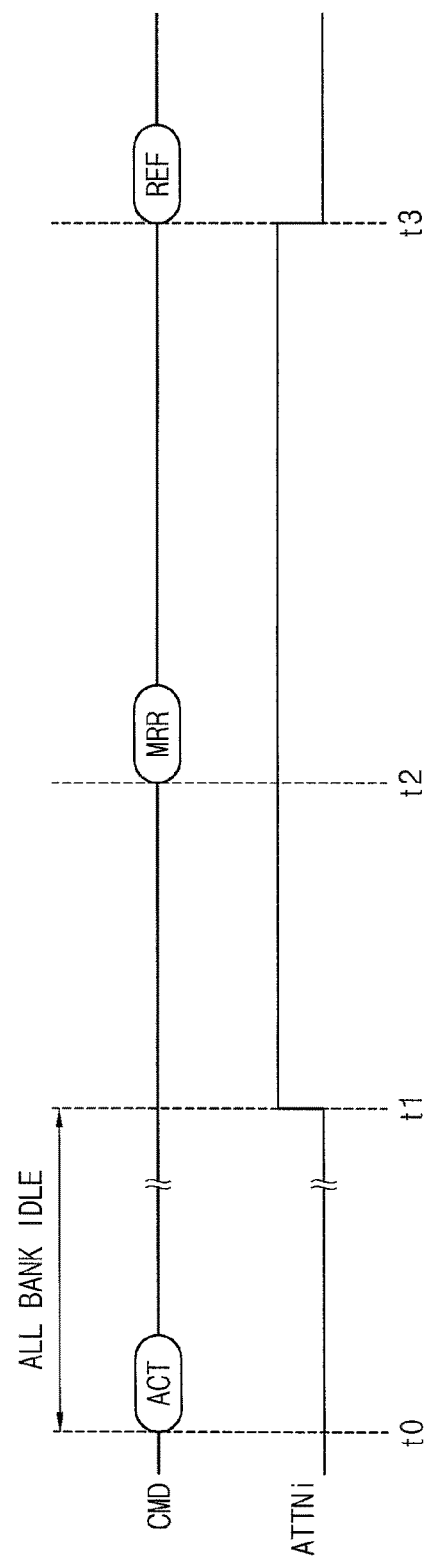
FIG. 12 is a timing diagram for describing a refresh operation based on an attention signal according to example embodiments.

FIG. 12 is a timing diagram for describing a refresh operation based on an attention signal according to example embodiments, and FIG. 13 is a diagram for describing a mode register for the refresh operation based on the attention signal of FIG. 12.

The memory device 400 in FIG. 4 may generate an attention signal ATTN that is activated when a refresh operation is required with respect to at least one of the memory banks 480*a*~480*h*. The memory controller 200 may generate a refresh command REF based on the attention signal ATTN.

Referring to FIG. 12, the control logic 160 in the refresh controller 100 of FIG. 5 may activate an attention signal ATTNi for the corresponding memory bank BANKi when the memory controller 200 does not issue an additional active command ACT until time point t1 after a reference time from when the last active command ACT is issued at time point t0.

In example embodiments, the memory device 400 may activate the attention signal ATTN when an additional active command ACT or any other commands (e.g., read, write, refresh, etc.) is not received at any of the memory banks 480*a*~480*h* until the time point t1.

For example, the reference time may be set to integer multiple of the average refresh interval time tREFi, that is, tREFi*K, where K is a positive integer. The positive integer K may corresponds to the maximum count value of each of the pull-in counters PICa~PICh. In this case, the count value CNTi of the corresponding pull-in counter PICi may be the minimum count value (e.g., 0) at time point t1. In other words, the control logic 160 in the refresh controller 100 may activate the attention signal ATTNi at the time point t1 when the count value CNTi becomes the minimum count value.

Such attention signals ATTNa~ATTNh may be provided to the control logic 410 in FIG. 4. The control logic 410 may store refresh bank information in the mode register set 412 where the refresh bank information represent the memory banks that require the refresh operation among the memory banks 480a~480h. For example, the associated mode register in the mode register set 412 may have a setting configuration MRSET as illustrated in FIG. 13. A plurality of operand values OP0~OP7 may represent whether the respective memory banks A~H require a refresh operation urgently. For example, the value "1" of each operand may indicate the urgent requirement of the refresh operation and FIG. 13 indicates that the two memory banks B and D require the refresh operation. The control logic 410 may provide the combined attention signal ATTN to the memory controller 200 based on the attention signals ATTNa~ATTNh corresponding to the respective memory banks 480a~480h.

The memory controller 200 may generate a mode register read command MRR at time point t2 to receive the refresh bank information from the memory device 400. The memory controller 200 may generate a refresh command REF based on the received refresh bank information at time point t3. The memory controller 200 may generate all bank refresh command REFab or per bank refresh command REFpb depending on the refresh bank information.

Figure 14:
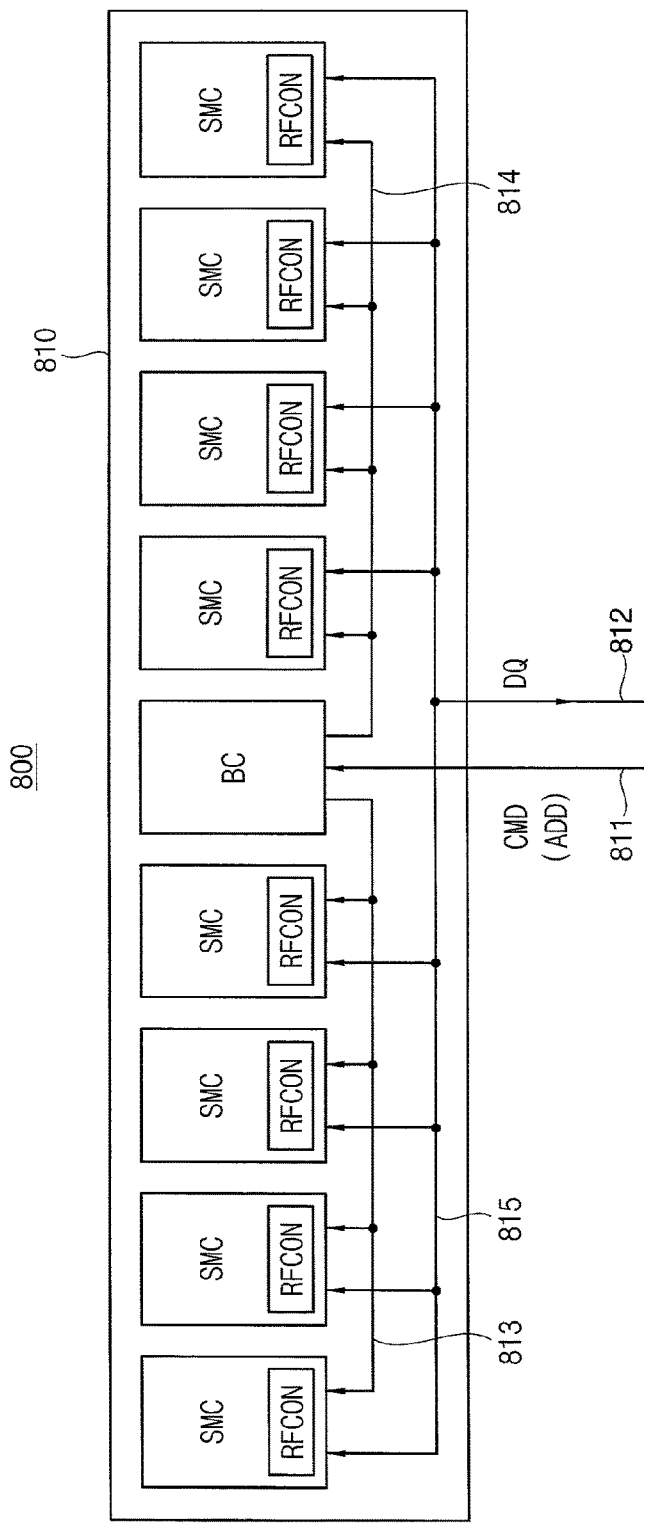
FIG. 14 is a block diagram illustrating a memory module according to example embodiments.

FIG. 14 is a block diagram illustrating a memory module according to example embodiments.

Referring to FIG. 14, a memory module 800 may include a module substrate 810, a plurality of semiconductor memory chips SMC and a buffer chip BC.

The semiconductor memory chips SMC may be mounted on the module substrate 810 and each of the semiconductor memory chips SMC may receive data DQ from an external device such as a memory controller through a data bus 812 in a write mode, or transmit the data DQ to the external device through the data bus 812 in a read mode.

The buffer chip BC may be mounted on the module substrate 810 and the buffer chip BC may receive command signals CMD and address signals ADD through a control bus 811 to provide the received signals CMD and ADD to the semiconductor memory chips SMC through internal buses 813 and 814. The buffer chip BC may include a register to store control information of the memory module 800.

The semiconductor memory chips SMC may include respective refresh controllers RFCON (e.g., refresh controller 100) as described with reference to FIGS. 1 through 13. Using the refresh controllers RFCON, the semiconductor memory chips SMC may be operated selectively in the access mode or the self-refresh mode in response to the self-refresh command received from the memory controller, perform the refresh operation in the access mode in response to the active command received from the memory controller and perform the refresh operation in the self-refresh mode in response to at least one clock signal.

Figure 15:
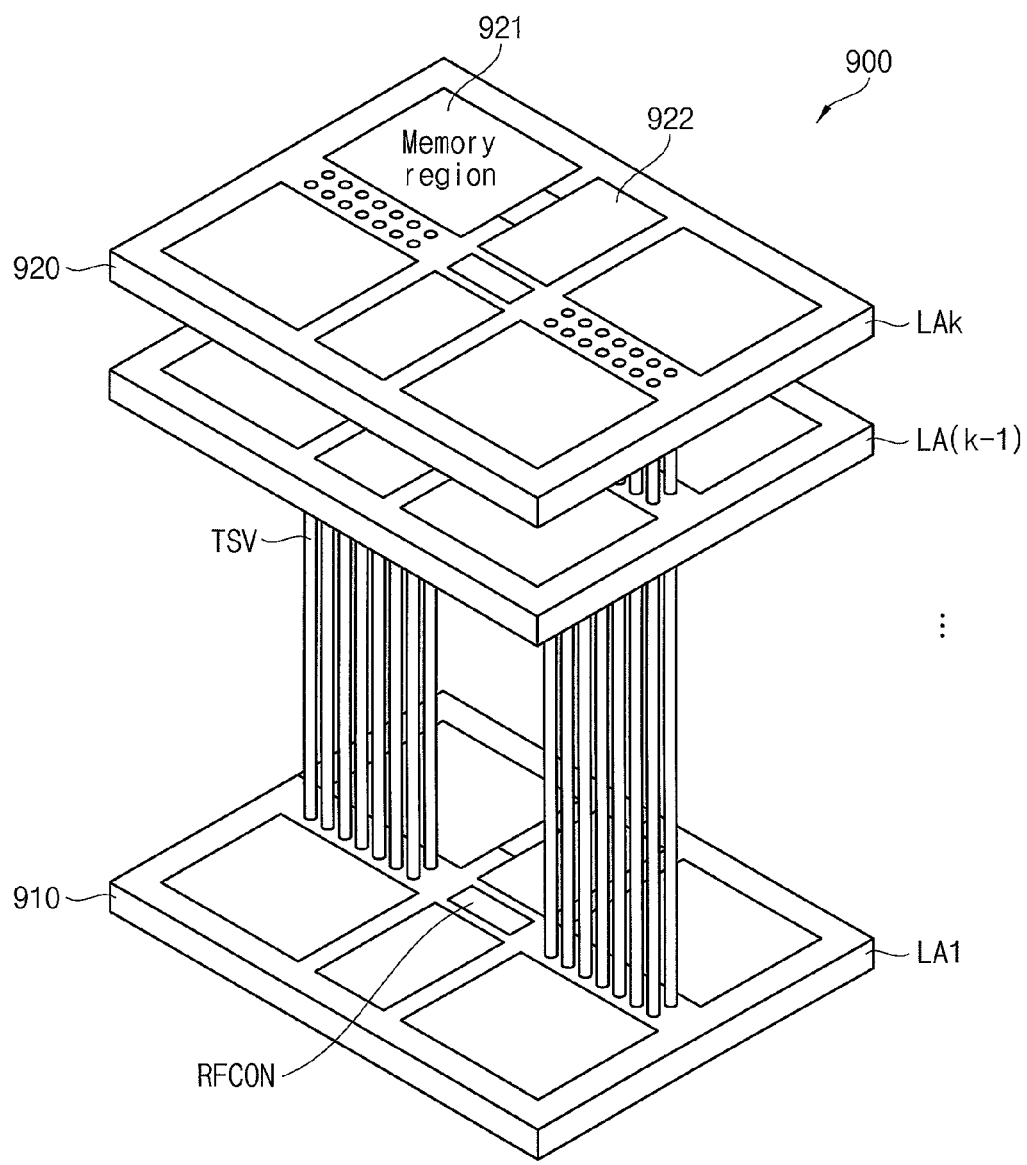
FIG. 15 is a diagram illustrating a structure of a stacked memory device according to example embodiments.

FIG. 15 is a diagram illustrating a structure of a stacked memory device according to example embodiments.

Referring to FIG. 15, a semiconductor memory device 900 may include first through kth semiconductor integrated circuit layers LA1 through LAk, in which the lowest first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias (e.g., through-silicon vias TSVs). The lowest first semiconductor integrated circuit layer LA1 as the master layer may communicate with an external memory controller through a conductive structure formed on an external surface.

The first semiconductor integrated circuit layer 910 through the kth semiconductor integrated circuit layer 920 may include memory regions 921 and various peripheral circuits 922 for driving the memory regions 921. For example, the peripheral circuits may include a row (X)-driver for driving wordlines of a memory, a column (Y)-driver for driving bit lines of the memory, a data input/output unit for controlling input/output of data, a command buffer for receiving a command from outside and buffering the command, and an address buffer for receiving an address from outside and buffering the address.

The first semiconductor integrated circuit layer 910 may further include a control logic and the control logic may generate control signals to control the memory region 921 based on the command-address signals from the memory controller.

According to example embodiments, the first semiconductor integrated circuit layer 910 may include respective refresh controllers RFCON as described with reference to FIGS. 1 through 13. Using the refresh controllers RFCON, the semiconductor memory device 900 may be operated selectively in the access mode or the self-refresh mode in response to the self-refresh command received from the memory controller, perform the refresh operation in the access mode in response to the active command received from the memory controller and perform the refresh operation in the self-refresh mode in response to at least one clock signal.

Figure 16:
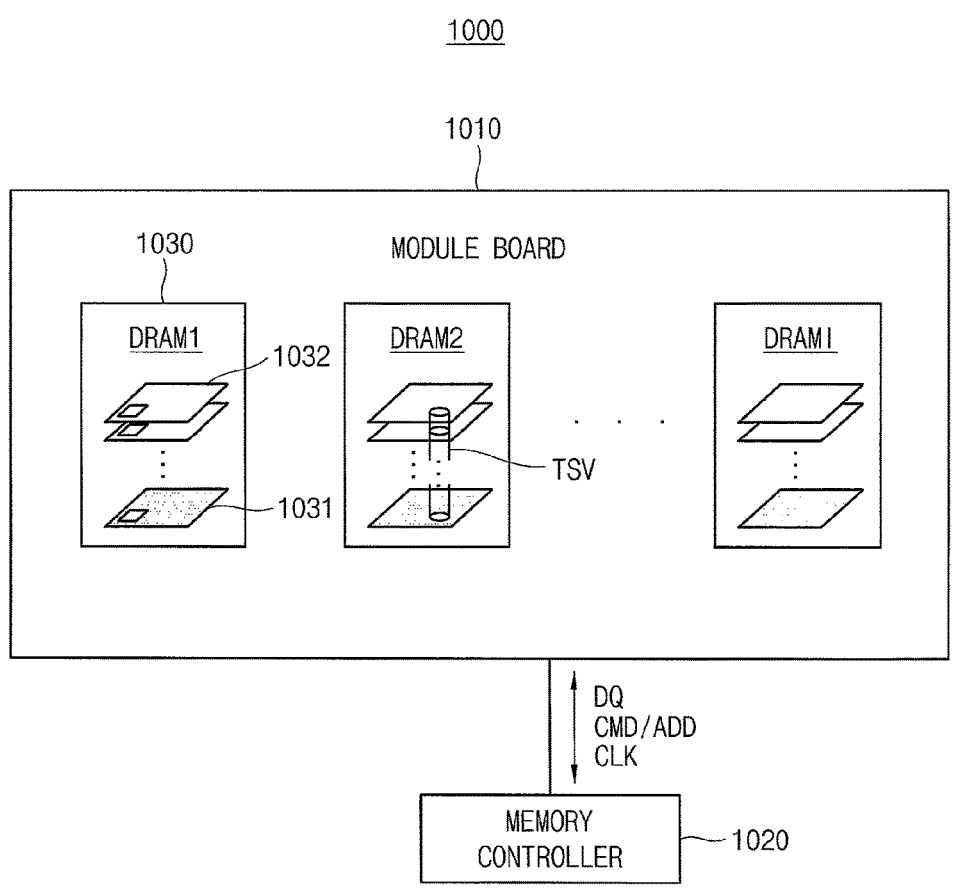
FIG. 16 is a block diagram illustrating a memory system according to example embodiments.

FIG. 16 is a block diagram illustrating a memory system according to example embodiments.

Referring to FIG. 16, a memory system 1000 may include a memory module 1010 and a memory controller 1020. The memory module 1010 may include at least one semiconductor memory device 1030 mounted on a module substrate. For example, the semiconductor memory device 1030 may be constructed as a DRAM chip. In addition, the semiconductor memory device 1030 may include a stack of semiconductor dies. In some example embodiments, the semiconductor dies may include the master die 1031 and the slave dies 1032. Signal transfer between the semiconductor dies may occur via through-substrate vias (e.g., through-silicon vias TSV) and/or bonding wires.

The memory module 1010 may communicate with the memory controller 1020 via a system bus. Data DQ, a command/address CMD/ADD, and a clock signal CLK may be transmitted and received between the memory module 1010 and the memory controller 1020 via the system bus.

As described above, the semiconductor memory device 1030 may include respective refresh controller as described with reference to FIGS. 1 through 13. Using the refresh controller, the semiconductor memory device 1030 may be operated selectively in the access mode or the self-refresh mode in response to the self-refresh command received from the memory controller, perform the refresh operation in the access mode in response to the active command received from the memory controller and perform the refresh operation in the self-refresh mode in response to at least one clock signal.

Figure 17:
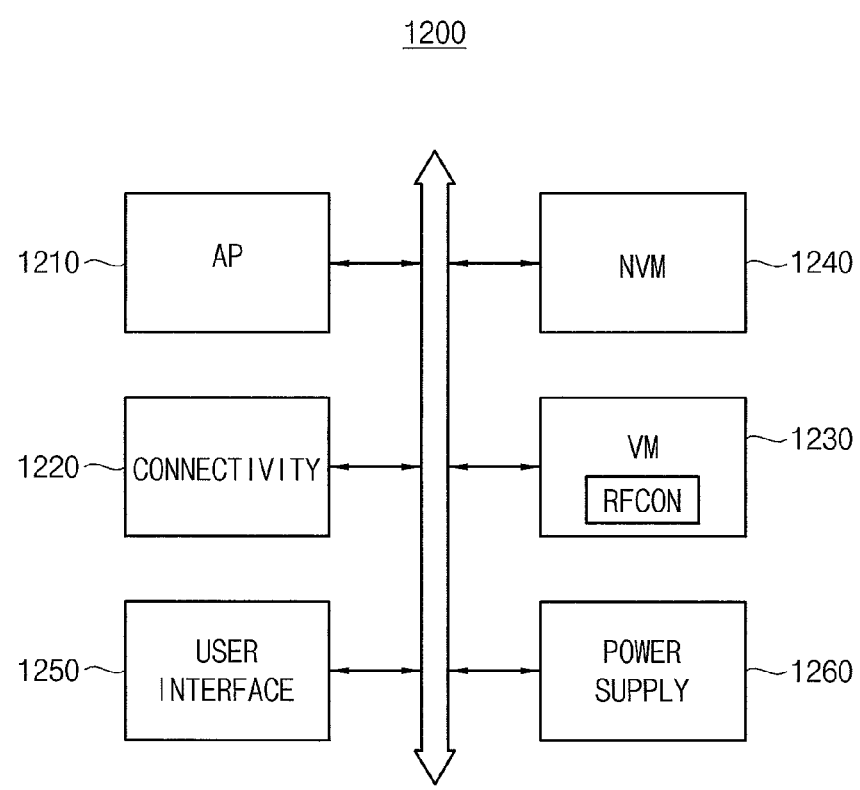
FIG. 17 is a block diagram illustrating a mobile system according to example embodiments.

FIG. 17 is a block diagram illustrating a mobile system according to example embodiments.

Referring to FIG. 17, a mobile system 1200 includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. According to example embodiments, the volatile memory device 1230 may include respective refresh controller RFCON as described with reference to FIGS. 1 through 13. Using the refresh controller RFCON, the volatile memory device 1230 may be operated selectively in the access mode or the self-refresh mode in response to the self-refresh command received from the memory controller, perform the refresh operation in the access mode in response to the active command received from the memory controller and perform the refresh operation in the self-refresh mode in response to at least one clock signal.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (S SOP), thin small outline package (TSOP), system in package (SIP), multi-chip package (MCP), wafer-level fabricated package (WFP), wafer-level processed stack package (WSP), etc.

Figure 18:
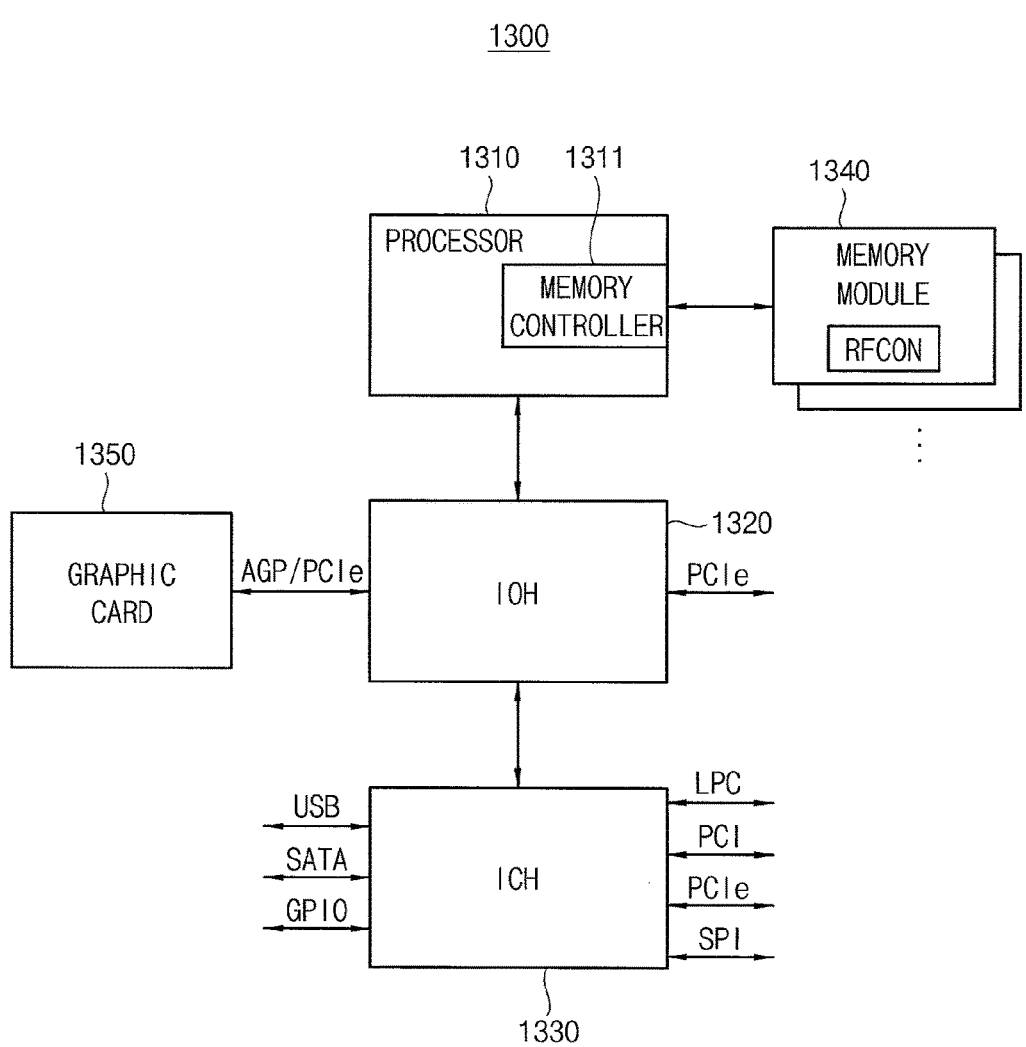
FIG. 18 is a block diagram illustrating a computing system according to example embodiments.

FIG. 18 is a block diagram illustrating a computing system according to example embodiments.

Referring to FIG. 18, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 18 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include at least one memory chip. The memory chip may include respective refresh controller RFCON as described with reference to FIGS. 1 through 13. Using the refresh controller RFCON, the memory chip may be operated selectively in the access mode or the self-refresh mode in response to the self-refresh command received from the memory controller, perform the refresh operation in the access mode in response to the active command received from the memory controller and perform the refresh operation in the self-refresh mode in response to at least one clock signal.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 18 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset. Also, while many features of the embodiments are disclosed as units, in other embodiments those features may be implemented as other forms of logic including but not limited to code-based operations performed by a processor.

As such, the memory device and the memory system including the memory device according to example embodiments may prevent collision between the access operation and the refresh operation by performing the mode switching between the access mode and the self-refresh mode in response to the command received from the memory controller. In addition, the memory device and the memory system including the memory device according to example embodiments may enhance efficiency of access to the memory device by performing the refresh operation during the access mode without receiving the refresh command from the memory controller. Further, the memory device and the memory system including the memory device according to example embodiments may prevent data loss by performing the burst self-refresh and then performing the normal self-refresh when entering the self-refresh mode.

The present disclosure may be applied to arbitrary devices and systems including a memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
   a memory bank including a plurality of memory blocks, each memory block including a plurality of memory cells arranged in rows and columns;
   a row selection circuit configured to select one or more rows such that the memory device performs an access operation and a refresh operation with respect to the memory bank in response to an active command received from a memory controller; and
   a refresh controller configured to control the row selection circuit such that the memory device is operated selectively in an access mode in response to the active command or a self-refresh mode in response to a self-refresh command received from the memory controller, and the refresh controller configured to, when entering the self-refresh mode, control the row selection circuit such that the refresh operation is performed first by a burst number in response to a first clock signal having a first clock period, and then in response to a second clock signal having a second clock period longer than the first clock period,
   wherein the refresh operation is performed in the access mode in response to the active command,
   wherein the refresh operation is performed in the self-refresh mode in response to at least one clock signal, and
   wherein the refresh controller includes:
   a pull-in counter configured to store a count value changing between a minimum count value and a maximum count value such that the count value is increased whenever the refresh operation for one row of the memory bank is completed and the count value is decreased whenever an average refresh interval time elapses.

2. The memory device of claim 1, further comprising:
   a mode register configured to store burst information for controlling the memory device,
   wherein the burst number is determined based on the burst information stored in the mode register and the burst information is provided through a mode register write command received from the memory controller.

3. The memory device of claim 1, wherein the burst number is determined based on a time point when the count value of the pull-in counter attains the maximum count value.

4. The memory device of claim 1, wherein the refresh controller is configured to, when the count value of the pull-in counter corresponds to the maximum count value, control the row selection circuit such that the refresh operation of the memory bank is not performed even though the active command is received.

5. The memory device of claim 1, wherein the memory controller is configured to generate the self-refresh command based on a frequency of generating the active command.

6. The memory device of claim 1, wherein the refresh controller is configured to generate an attention signal that is activated when a refresh operation is required with respect to the memory bank, and
wherein the memory controller is configured to generate the self-refresh command based on the attention signal.

7. The memory device of claim 1, wherein the row selection circuit is configured to, in the access mode, enable a first memory block corresponding to an access address among the plurality of memory blocks and selectively enable or disable a second memory block corresponding to a refresh address among the plurality of memory blocks, and
wherein the row selection circuit is configured, in the self-refresh mode, to enable the second memory block corresponding to the refresh address.

8. The memory device of claim 1, wherein the memory device is a three-dimensional memory device where a plurality of semiconductor dies are stacked vertically.

9. A memory system comprising:
a memory device; and
a memory controller configured to control the memory device,
wherein the memory device comprises:
 a plurality of memory banks, each memory bank including a plurality of memory blocks;
 a plurality of bank row selection circuits configured to perform an access operation and a refresh operation with respect to the plurality of memory banks; and
 a refresh controller configured to control the plurality of bank row selection circuits such that the memory device is operated selectively in an access mode in response to an active command received from the memory controller or a self-refresh mode in response to a self-refresh command received from the memory controller, and the refresh controller configured to, when entering the self-refresh mode, control the row selection circuit such that the refresh operation is performed first by a burst number in response to a first clock signal having a first clock period, and then in response to a second clock signal having a second clock period longer than the first clock period,
wherein the refresh operation is performed in the access mode in response to the active command and the refresh operation is performed in the self-refresh mode in response to at least one clock signal, and
wherein the refresh controller includes:
 a pull-in counter configured to store a count value changing between a minimum count value and a maximum count value such that the count value is increased whenever the refresh operation for one row of the memory bank is completed and the count value is decreased whenever an average refresh interval time elapses.

10. The memory system of claim 9, wherein the refresh controller is configured to, when entering the self-refresh mode, control the plurality of bank row selection circuits such that the refresh operation is performed first by a burst number in response to a first clock signal having a first clock period, and then in response to a second clock signal having a second clock period longer than the first clock period.

11. The memory system of claim 9, wherein the memory controller is configured to generate the self-refresh command based on a frequency of generating the active command and generate a self-refresh entry command when an idle state in which the access operation is not performed with respect all of the plurality of memory banks is maintained for a predetermined amount of time.

12. The memory system of claim 9, wherein the refresh controller is configured to generate an attention signal that is activated when a refresh operation is required with respect to at least one of the plurality of memory banks, and
wherein the memory controller is configured to generate a refresh command based on the attention signal.

13. The memory system of claim 9, wherein the memory device further comprises a mode register configured to store refresh bank information for controlling the memory device,
wherein the refresh bank information represents memory banks to be required the refresh operation among the plurality of memory banks, and
wherein the memory controller is configured to generate a mode register read command to receive the refresh bank information from the memory device and generate a refresh command based on the received refresh bank information.

14. A memory device comprising:
a memory cell array including a plurality of memory banks, each bank having a plurality of memory cells arranged in rows and columns;
a row decoder configured to select one or more rows for a refresh operation;
a refresh control circuit configured to control the row decoder such that the memory device performs the refresh operation, and the refresh controller configured to, when entering the self-refresh mode, control the row selection circuit such that the refresh operation is performed first by a burst number in response to a first clock signal having a first clock period, and then in response to a second clock signal having a second clock period longer than the first clock period; and
a mode register set configured to store address information to be refreshed on memory cells corresponding to the address information,
wherein the memory device is configured to transmit an attention signal to a memory controller when all of the memory banks are not activated for a predetermined amount of time,
wherein the memory controller is configured to read the address information from the mode register set when the attention signal is received,
wherein the memory device is configured to start the refresh operation based on the address information read from the mode register, and
wherein the refresh control circuit includes:
a pull-in counter configured to store a count value changing between a minimum count value and a maximum count value such that the count value is increased whenever the refresh operation for one row of the memory bank is completed and the count value is decreased whenever an average refresh interval time elapses.

15. The memory device of claim 14, wherein the memory device is configured such that when all of the memory banks are not activated for the predetermined amount of time, a memory controller transmits a self-refresh command to the memory device for the refresh operation of the memory device.

16. The memory device of claim 14, wherein the refresh operation includes a burst self-refresh operation and a normal self-refresh operation, and
   wherein the memory device is configured to perform the burst self-refresh operation in response to a first clock signal having a first clock period, and to perform the normal self-refresh operation in response to a second clock signal having a second clock period longer than the first clock period.

* * * * *